United States Patent [19]

Lenander et al.

[11] Patent Number: 5,705,263
[45] Date of Patent: Jan. 6, 1998

[54] COATED CUTTING TOOL

[75] Inventors: Anders Lenander, Tyresö ; Leif Åkesson, Älvsjö, both of Sweden

[73] Assignee: Sandvik AB, Sandviken, Sweden

[21] Appl. No.: 407,657

[22] Filed: Mar. 21, 1995

[30] Foreign Application Priority Data

Mar. 22, 1994 [SE] Sweden ................... 9400951

[51] Int. Cl.$^6$ ................... C23C 16/30
[52] U.S. Cl. ................... 428/216; 428/336; 428/457; 428/469; 428/697; 428/698; 428/699; 428/701; 428/702
[58] Field of Search ................... 428/216, 336, 428/698, 472, 469, 701, 702, 457, 697, 699

[56] References Cited

U.S. PATENT DOCUMENTS

| | | | |
|---|---|---|---|
| 4,101,703 | 7/1978 | Schintlmeister | 428/698 |
| 4,282,289 | 8/1981 | Kullander et al. | |
| 4,341,834 | 7/1982 | Kikuchi et al. | 428/216 |
| 4,399,168 | 8/1983 | Kullander et al. | |
| 4,447,263 | 5/1984 | Sugizawa et al. | 428/698 |
| 4,525,415 | 6/1985 | Poral | 428/336 |
| 4,746,563 | 5/1988 | Nakano et al. | 428/216 |
| 5,135,801 | 8/1992 | Nyström et al. | 428/216 |
| 5,380,408 | 1/1995 | Svensson | 204/129.1 |

FOREIGN PATENT DOCUMENTS

| | | |
|---|---|---|
| 263747 | 4/1988 | European Pat. Off. . |
| 1425633 | 2/1976 | United Kingdom . |

OTHER PUBLICATIONS

Dialog Information Services, file 351, Dialog accession No. 009773728, WPI accession No. 94-053579/07, week 9407, abstract of JP, A, 6008008 (Mitsubishi Materials Corp) 18 Jan. 1994 (18.01.94), & JP 6008008, A, 940118.

Patent Abstracts of Japan, vol. 11, No. 063 (C-406), 26 Feb. 1987, & JP-A-61 223181, (Mitsubishi Metal Corp), 3 Oct. 1986.

Primary Examiner—Archene Turner
Attorney, Agent, or Firm—Burns, Doane, Swecker & Mathis, L.L.P.

[57] ABSTRACT

The present invention relates to CVD-coated cemented carbide tool used for chip forming machining. More particularly, it relates to a coating with an intermediate layer acting as a diffusion barrier thus influencing the coating structure and coating adhesion of the following layer.

17 Claims, 1 Drawing Sheet

COATED CUTTING TOOL

BACKGROUND OF THE INVENTION

The present invention relates to sintered cemented carbide bodies coated with thin, extremely wear resistant surface layers. More particularly, it relates to coated cemented carbides bodies in which a thin oxygen-containing layer deposited between layers of carbides, nitrides and/or carbonitrides improves the properties of the coated body.

Coated cutting tool inserts are widely used in the metal machining industry to machine iron and iron-based alloys. Increasing the tool life of such tools by carbide, nitride, carbonitride and/or oxide coatings is a well-established technology. Cutting inserts are usually coated with layers of carbide, nitride and carbonitride of titanium or a related metal. The coating in many cases also includes one or several layers of alumina, a coating material which cannot conveniently be deposited directly onto a cemented carbide substrate by the conventionally used Chemical Vapor Deposition Processes (CVD). Henceforth, it is a common practice to deposit a layer of carbide, carbonitride and/or nitride of, e.g., titanium, prior to the deposition of $Al_2O_3$.

When a cemented carbide substrate is coated with a wear resistant coating of carbide, carbonitride, or nitride by a CVD process at a temperature of 800° C.–1200° C., the constituencies of the substrate, e.g., tungsten, cobalt, carbon, will thermally diffuse into the growing coating and influence the crystal growth direction, microstructure, coating cohesion, etc. Consequently, the physical, chemical and mechanical properties of the coating will be affected by the presence of diffused species from the substrate.

U.S. Pat. No. 5,135,801 discloses a coated cemented carbide body with an innermost (closest to the substrate) oxygen-containing layer. The object of that invention was to suppress the carbon diffusion into the coating in order to minimize the decarburization of the substrate surface by applying said oxygen-containing layer, e.g., TiCO or TiCON, directly onto the cemented carbide substrate. That patent also discloses the possibility of including a thin (0.1–1 μm) layer between the oxygen-containing layer and the substrate in order to enhance adhesion or induce metal into the overlying coating or substrate.

OBJECTS AND SUMMARY OF THE INVENTION

It is an object of this invention to avoid or alleviate the problems of the prior art.

It is further an object of this invention to provide sintered cemented carbide bodies coated with thin, extremely wear resistant surface layers.

In one aspect of the invention there is provided a coated cemented carbide body wherein said coating comprises a first layer or set of layers which suppress metal diffusion of $MetC_xN_{1-x}(0 \leq x \leq 1)$ adjacent to the substrate followed by a second layer of $MetC_xO_yN_z$, where $0.7 \leq x+y+z \leq 1.3$ and $0.2 < y < 0.8$, which is further followed by a third layer of $MetC_xN_{1-x}(0 \leq x \leq 1)$ where Met is selected from the group of Ti, Zr, Hf, V, Nb and Ta and where the thickness of the first layer $MetC_xN_{1-x}(0 \leq x \leq 1)$ is greater than 1 μm and up to 5 μm or, alternatively, 0.5–5 when the substrate is essentially free from surface cobalt.

In another aspect of the invention there is provided a method of making a coated cemented carbide body comprising:

1) forming a first layer or set of layers which suppress metal diffusion of $MetC_xN_{1-x}(0 \leq x \leq 1)$ adjacent to a cemented carbide substrate where Met is selected from the group of metals Ti, Zr, Hf, V, Ta, Nb in which the substrate is contacted with a gas containing hydrogen, nitrogen and hydrocarbons and one or more halides of the above-mentioned metals at a temperature range of 800° C.–1200° C. and a process pressure of 5–1050 mbar;

2) forming a second layer, directly on the first layer, of $MetC_xO_yN_z$, where $0.7 \leq x+y+z \leq 1.3$ and $0.2 < y < 0.8$ by contacting the first layer with a gas containing hydrogen, nitrogen, carbon monoxide and one or more halides of the above-mentioned metals at a temperature range of 800° C.–1200° C. and a process pressure of 5–1050 mbar; and 3) forming a third layer directly on the second layer, of $MetC_xN_{1-x}(0 \leq x \leq 1)$ by contacting the second layer with a gas containing hydrogen, nitrogen, hydrocarbon and one or more halides of the above-mentioned metals at a temperature range of 800° C.–1200° C. and a process pressure of 5–1050 mbar.

DETAILED DESCRIPTION OF THE PREFERRED EMBODIMENTS OF THE INVENTION

Figure 1:
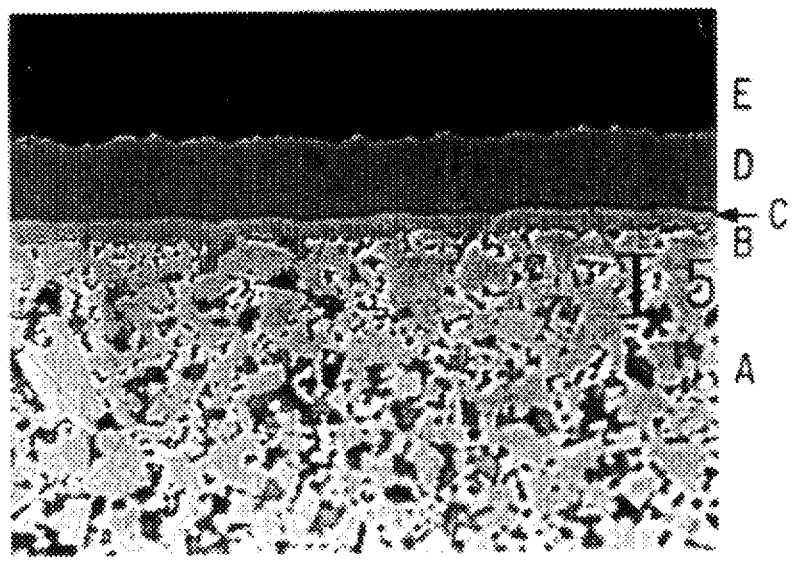
FIG. 1 shows in 1600× magnification a polished and etched section of a coating according to the invention in which A=cemented carbide
B=first layer (TiCN)
C=second layer (TiCO)
D=third layer (TiCN)
E=fourth layer ($Al_2O_3$)
Figure 2:
FIG. 2 shows a fracture surface in 4000× magnification of the same coating and with the same designations as in FIG. 1.

The presently claimed invention includes a method that suppresses the diffusion of species from the substrate into the coating by applying a thin TiCO layer as an intermediate layer between a first $TiC_xN_{1-x}(0 \leq x \leq 1)$ layer applied directly onto the substrate and a further $TiC_xN_{1-x}(0 \leq x \leq 1)$ applied on top of the TiCO layer. The intermediate layer may also consist of successive layers. Furthermore, on top of the above-mentioned combination of carbonitride, carboxide and carbonitride layers, further layers may be deposited of, for example, $Al_2O_3$ or again metal carbide and/or nitride layers.

It has surprisingly been found that the intermediate layer of TiCO or TiCON effectively suppresses diffusion, particularly the Co and W diffusion, from the substrate into the coating and thus strongly influences the microstructure and chemical properties of said coating, resulting in much enhanced wear properties of, e.g., a coated cutting tool. Furthermore, the suppression of Co diffusion also improves the adhesion between adjacent layers in the sandwiched coating combination by reducing the detrimental effect of Co enrichment at layer interfaces.

According to the presently claimed invention, there is now provided a cemented carbide body with a coating comprising three consecutive layers. Met refers to Ti, Zr, Hf, V, Nb or Ta.

1) A first $MetC_xN_{1-x}(0 \leq x \leq 1)$-layer is applied directly onto the cemented carbide body. It is understood that this first layer can be composed of several layers each of $MetC_xN_{1-x}(0 \leq x \leq 1)$. Preferably, this first layer is TiC. The thickness of this first layer is greater than 1 µm and up to 5 µm, preferably up to 2 µm. The minimum thickness of this first layer can be reduced to 0.5 µm if the binder phase present on the surface of the cemented carbide body is removed prior to the deposition. The binder phase can be removed by blasting. However, electrolytic methods are preferred, e.g., according to U.S. Pat. No. 5,380,408.

2) A second layer Met $C_xO_yN_z$ applied directly on the first $TiC_xN_{1-x}(0 \leq x \leq 1)$-layer. This layer is 0.1–5 µm, preferably 0.2–1 µm thick. The composition of Met $C_xO_yN_z$ is $0.7 \geq x+y+z \geq 1.3$ and $0.2 < y < 0.8$, preferably $0.4 < y < 0.6$. Preferably, Met=Ti and z=0.

3) A third layer $MetC_xN_{1-x}(0 \leq x \leq 1)$ applied directly on the Met $C_xO_yN_z$ layer. The thickness of this third wear resistant layer is 1–20 µm, preferably 5–12 µm and is preferably thicker than the total thickness of the first and second layers. Preferably, this third layer is $TiC_xN_{1-x}$, where $0.05 \leq x \leq 0.95$, preferably $0.3 \leq x \leq 0.7$. Compared to a TiCN-layer applied on a coated substrate coated with layers such as TiC, TiN or TiCN which are not as effective a diffusion barrier layer as the MetCON layer, this TiCN-layer exhibits improved wear properties when, e.g., applied on a cutting tool, which probably is due to a favorable crystal orientation of this third layer.

Preferably, the TiCN-layer of the presently claimed invention has a preferred crystallographic growth orientation in the (220)-direction (determined by X-ray Diffraction (XRD) measurements). A Texture Coefficient, TC, can be defined as:

$$TC(hkl) = \frac{I(hkl)}{I_o(hkl)} \left\{ \frac{1}{n} \Sigma \frac{I(hkl)}{I_o(hkl)} \right\}^{-1}$$

where

I(hkl)=measured intensity of the (hkl) reflection $I_o$(hkl)=standard intensity of the ASTM standard powder pattern diffraction data n=number of reflections used in the calculation, (hkl) reflections used are: (111), (200), (220).

According to the presently claimed invention, TC for the set of (220) crystal planes is greater than 1.3, preferably greater than 1.5, most preferably greater than 1.8.

On top of the above-mentioned combination of carbonitride, carbooxide and carbonitride layers, further layers may be deposited of, for example, $Al_2O_3$ and/or various metal carbides and/or nitrides. Preferably, the layers comprise an outermost layer of fine-grained α-alumina according to U.S. Ser. No. 08/159,217 (our reference: 024000-993), possibly followed by a thin TiN-layer deposited after the alumina layer has been smoothed by, e.g., using a blasting method.

The coating according to the presently claimed invention, can be applied to cemented carbide bodies based on straight WC-Co compositions as well as WC-cubic carbides-Co-compositions where the cubic phase comprises carbides or carbonitrides of Ti, Ta and/or Nb. It can also be applied to so-called gradient sintered cemented carbides which has a surface zone enriched in binder phase, e.g., according to U.S. Ser. Nos. 08/159,257 and 08/258,598 (our references: 024000-991 and 024000-927, respectively).

The invention also relates to a method of making a body comprising a substrate of cemented carbide with a coating comprising the following:

1) a first layer or a set of layers $MetC_xN_{1-x}(0 \leq x \leq 1)$ which suppresses metal diffusion adjacent to the substrate where Met is selected from the group of metals Ti, Zr, Hf, V, Ta and Nb and in which the substrate is contacted with a gas containing hydrogen, nitrogen and hydrocarbons and one or more halides of the above-mentioned metals, forming a carbide, nitride or carbonitride at a process pressure of 5–1050 mbar, preferably 30–100 mbar, 2) a second layer, directly on the first layer, of $MetC_xO_yN_z$ deposited in a gas containing hydrogen, nitrogen, carbon monoxide and one or more halides of the above-mentioned metals forming an oxycarbide or oxynitrocarbide at a process pressure of 5–1050 mbar, preferably 30–100 mbar, and 3) a third layer directly on the second layer, of $MetC_xN_{1-x}(0 \leq x \leq 1)$ deposited in a gas containing hydrogen, nitrogen, hydrocarbon and one or more halides of the above-mentioned metals forming a carbonitride at a process pressure of 5–1050 mbar, preferably 200–600 mbar.

In a preferred embodiment, an outer alumina layer is then deposited by vapor deposition in a gas containing hydrogen and carbon dioxide and aluminum halides. Preferably, this alumina layer is an α-alumina layer deposited by vapor deposition in a gas containing hydrogen and carbon dioxide and aluminum halides.

Most preferably an outermost TiN layer is deposited on the top of the alumina layer by vapor deposition in a gas containing hydrogen, nitrogen and titanium halides.

The process temperature during the CVD deposition steps may be in the range of 800° C.–1200° C., preferably 900° C.–1070° C. The different process steps may be carried out in the same coating equipment or in separate equipment. Depending on the selection of the oxygen-containing gas precursor during the CVD process step of the second layer $MetC_xO_yN_z$, inclusion of atoms other than nitrogen and carbon may occur in said layer, e.g., sulphur, tellurium, selenium, phosphorous and/or arsenic.

The first and second layers may alternatively be deposited by Physical Vapor Deposition (PVD) such as reactive magnetron sputtering, ion plating or cathodic arc discharge deposition.

The invention is additionally illustrated in connection with the following Examples which are to be considered as illustrative of the present invention. It should be understood, however, that the invention is not limited to the specific details of the Examples.

Example 1

Cemented carbide cutting inserts CNMG 120408 with the composition 5.5% Co, 8.6% cubic carbides (TiC-TaC-NbC) and balance WC were coated with TiC for a period of 1 hour prior to the deposition of intermediate layer TiCO (process gas composition: 4% $TiCl_4$, 7% CO, 3% HCl, balance $H_2$, pressure 50 mbar and substrate temperature 1000° C.). Following the deposition of the TiCO-layer, a wear resistant TiCN layer was deposited for a period of 4 hours at a pressure of 400 mbar followed by a further deposition of a fine-grained α-$Al_2O_3$ layer (according to U.S. Ser. No. 08/159,217) deposited for a period of 6 hours. (Variant A).

Cemented carbide cutting inserts as used for Variant A were subjected to an additional electrolytic surface cleaning operation to remove binder phase on the surface prior to the coating process according to the above. (Variant B).

Cemented carbide cutting inserts as used for Variant A were also processed with an identical CVD process as above but excluding the second layer TiCO (Variant C).

Variants A, B and C were all wet blasted with 150 mesh alumina grit in order to smooth the coating surface and thereafter coated with a thin TiN coating. The blasting treatment in combination with the outermost TiN coating gives the inserts a bright and shiny appearance that facilitates the identification of used edges.

The coated inserts were examined with respect to presence and thickness of eta-phase layer in µm, coating thickness, µm, texture coefficient (TC) for the (220) growth direction of the wear resistant TiCN-layer and mean grain size of the crystals in the $Al_2O_3$ layer in µm with the following results:

|  | A | B | C (prior art) |
|---|---|---|---|
| Eta-phase | traces | none | 0.5 |
| TiC | 1.5 | 0.7 | 1.6 |
| TiCO | 0.4 | 0.4 | — |
| TiCN | 7.0 | 7.0 | 7.2 |
| $Al_2O_3$ | 5.5 | 5.3 | 5.7 |
| TiN | 0.1 | 0.1 | 0.1 |
| Texture Coefficient TiCN | 2.0 | 1.9 | 1.2 |
| Grain Size $Al_2O_3$-layer | 1.9 | 1.7 | 1.7 |

Example 2

Cemented carbide cutting inserts CNMG 120408 with the composition 5.5% Co, 8.6% cubic carbides (TiC-TaC-NbC) and balance WC were coated with TiC for a period of 1.5 hours prior to the deposition of the intermediate oxygen, nitrogen-containing layer TiCON (process gas composition: 4% $TiCl_4$, 7% CO, 3% HCl, 25% $N_2$, balance 1–12, pressure 50 mbar and substrate temperature 100 0° C.). Following the deposition of the TiCON layer, a wear resistant TiCN layer was deposited for a period of 4 hours at a pressure of 600 mbar followed by a TiN layer deposited for a period of 2 hours. (Variant D).

Cemented carbide cutting inserts as used for Variant D were also processed with identical CVD processes but excluding the intermediate layer of TiCON. (Variant E).

The coated inserts were examined with respect to presence and thickness of eta-phase layer in µm, coating thickness, µm, and texture coefficient (TC) for the (220) growth direction of the wear resistant TiCN-layer with the following results:

|  | D | E (prior art) |
|---|---|---|
| Eta-phase | 1.1 | 1.7 |
| TiC | 1.9 | 2.1 |
| TiCON | 0.5 | — |
| TiCN | 8.2 | 8.5 |
| TiN | 1.6 | 1.4 |
| Texture Coefficient TiCN | 1.8 | 1.1 |

Example 3

Cemented carbide cutting inserts CNMG 120408 with the composition 6.5% Co, 8.76% cubic carbides (TiC-TaC-NbC) and balance WC and with a 25 µm thick binder phase enriched surface zone were coated with TiC for a period of 0.5 hours followed by the deposition of TiCN for a period of 0.25 hours prior to the deposition of the intermediate TiCO layer (process gas composition: 3% $TiCl_4$, 4% CO, 4% HCl, balance $H_2$, pressure 100 mbar and substrate temperature 1000° C.). Following the deposition of the intermediate layer, a wear resistant TiCN layer was deposited for a period of 4 hours at a pressure of 200 mbar, followed by the deposition of a fine-grained $\alpha$-$Al_2O_3$ layer (according to U.S. Ser. No. 08/159,217) deposited for a period of 1 hour and a top TiN layer deposited for a period of 1 hour. (Variant F).

Cemented carbide cutting inserts as used for Variant F were subjected to an additional electrolytic surface cleaning operation to remove binder metal from the surface prior to the coating process according to the above. (Variant G).

Cemented carbide cutting inserts as used for Variant F were also processed with an identical CVD process but excluding the intermediate TiCO layer. (Variant H).

The coated inserts were examined with respect to presence and thickness of eta-phase layer in µm, coating thickness and texture coefficient (TC) for the (220) growth direction of the wear resistant TiCN-layer:

|  | F | G | H (prior art) |
|---|---|---|---|
| Eta-phase | 0.7 | traces | 1.0 |
| TiC | 1.2 | 0.8 | 1.4 |
| TiCN | 0.3 | 0.2 | 0.4 |
| TiCO | 0.4 | 0.4 | — |
| TiCN | 3.6 | 3.7 | 3.9 |
| $Al_2O_3$ | 2.1 | 1.9 | 2.2 |
| TiN | 0.2 | 0.2 | 0.2 |
| Texture Coefficient TiCN | 1.7 | 1.6 | 1.1 |

Example 4

The coated cutting inserts Variant A to H were tested with respect to flaking of the coating when caused by edge deformation, in longitudinal mining of an alloyed steel (AISI 4340) at a feed of 0.7 mm/rev, cutting depth of 2.0 mm and varying the cutting speed in order to provoke different degrees of plastic deformation of the cutting edge. The edges were than examined with respect to plastic deformation measured as an edge depression and the concomitant flaking of the coating was estimated with the following results.

Inserts A, B, D, F, G, according to the invention, did not exhibit any flaking at all at an edge depression of at least 80 µm.

Insert C showed excessive loss of the coating on the clearance face at a edge depression of 40 µm.

Insert E showed excessive loss of the coating on the clearance face at an edge depression of 35 µm.

Insert H showed excessive loss of the coating on the clearance face at an edge depression of 45 µm.

Example 5

The coated cutting inserts from Example 1 were then tested with respect to rake face flaking in a facing operation in grey cast iron (AISI No35B). The shape of the machined work piece was such that the cut was interrupted twice during each revolution.

Cutting data:

Speed=500 m/min

Feed=0.5 mm/rev

Cutting depth=3.0 mm

The inserts were then examined with respect to flaking of the alumina coating on the rake face of the cutting insert. The results are expressed as rake face area subjected to flaking in relation to total rake face area in contact with the work piece chip.

| Results | |
|---|---|
| | Flaking |
| Inserts A (present invention) | 0% |
| Inserts B (present invention) | 0% |
| Inserts C (prior art) | 19% |

Example 6

The coated cutting inserts from Example 3 were tested with respect to rake face flaking in a facing operation in grey east iron (AISI No35B). The shape of the machined work piece was such that the cut was interrupted twice during each revolution.

Cutting data:
Speed=400 m/min
Feed=0.3 mm/rev
Cutting depth=3.0 mm

The inserts were then examined with respect to flaking of the alumina coating on the rake face of the cutting insert. The results are expressed as rake face area subjected to flaking in relation to total rake face area in contact with the work piece chip.

| Results | |
|---|---|
| | Flaking |
| Inserts F (present invention) | 0% |
| Inserts G (present invention) | 0% |
| Inserts H (prior art) | 26% |

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. In an alumina coated cemented carbide body, the improvement wherein said coating consists essentially of a first layer adjacent to the substrate comprising $MetC_xN_{1-x}$ ($0 \leq x \leq 1$) followed by a second layer of $MetC_xO_yN_z$, where $0.7 \leq x+y+z \leq 1.3$ and $0.2 < y < 0.8$ which is further followed by a third layer of $MetC_xN_{1-x}$ ($0 \leq x \leq 1$) where Met is selected from the group of Ti, Zr, Hf, V, Nb and Ta and where the thickness of the first layer $MetC_xN_{1-x}$ ($0 \leq x \leq 1$) is 0.5–5 μm and an outer layer of alumina.

2. In the coated body of claim 1 wherein in the third layer $MetC_xN_{1-x}$ ($0 \leq x \leq 1$) has a coating thickness exceeding the total thickness of the first and second layers.

3. In the coated body of claim 1 wherein the second layer is 0.1–5 μm thick.

4. In the coated body of claim 3 wherein the second layer is 0.2–1.0 μm thick.

5. In the coated body of claim 1 wherein the thickness of the first layer or set of layers $MetC_xN_{1-x}$ ($0 \leq x \leq 1$) adjacent to the substrate is up to 2.0 μm.

6. In the coated body of claim 5 wherein the thickness of the first layer or set of layers $MetC_xN_{1-x}$ ($0 \leq x \leq 1$) adjacent to the substrate is 0.5–2.0 μm when the substrate is essentially free from surface cobalt.

7. In the coated body of claim 3 wherein the thickness of the wear resistant third layer $MetC_xN_{1-x}$ ($0 \leq x \leq 1$) is less than 20 μm.

8. In the coated body of claim 7 wherein the thickness of the wear resistant third layer $MetC_xN_{1-x}$ ($0 \leq x \leq 1$) is 5–12 μm.

9. In the coated body of claim 1 wherein the wear resistant third layer $MetC_xN_{1-x}$ ($0 \leq x \leq 1$) is $TiC_xN_{1-x}$ where $0.05 \leq x \leq 0.95$.

10. In the coated body of claim 9 wherein the wear resistant third layer $MetC_xN_{1-x}$ ($0 \leq x \leq 1$) is $TiC_xN_{1-x}$ where $0.3 \leq x \leq 0.7$.

11. In the coated body of claim 1 wherein in the second layer y is $0.4 < y < 0.6$.

12. In the coated body of claim 9 wherein the wear resistant third layer has a preferred crystallographic growth orientation in the (220)-direction with a texture coefficient TC greater than 1.3, TC being defined as $$TC(hkl) = \frac{I(hkl)}{I_o(hkl)} \left\{ \frac{1}{n} \Sigma \frac{I(hkl)}{I_o(hkl)} \right\}^{-1}$$

where

I(hkl)=measured intensity of the (hkl) reflection $I_o$(hkl)=standard intensity of the ASTM standard powder pattern diffraction data n=number of reflections used in the calculation, (hkl) reflections used are: (111), (200), (220).

13. In the coated body of claim 12 wherein the wear resistant third layer has a preferred crystallographic growth orientation in the (220)-direction with a texture coefficient TC greater than 1.5.

14. In the coated body of claim 12 wherein the wear resistant third layer has a preferred crystallographic growth orientation in the (220)-direction with a texture coefficient TC greater than 1.8.

15. In the coated body of claim 1 wherein the alumina layer consists of a single phase α-alumina having a grain size s:

0.5 μm<s<3 μm.

16. In the coated body of claim 1 wherein said body comprises a TiN outermost layer.

17. In the coated body of claim 16 wherein the outermost TiN-layer is 0.01–1 μm thick.

* * * * *